US011167326B2

(12) United States Patent
Han et al.

(10) Patent No.: US 11,167,326 B2
(45) Date of Patent: Nov. 9, 2021

(54) SUBSTRATE PROCESSING APPARATUS AND NOZZLE UNIT

(71) Applicant: SEMES CO., LTD., Cheonan-si (KR)

(72) Inventors: Min Sung Han, Hwaseong-si (KR); Doyeon Kim, Yongin-si (KR); Jinkyu Kim, Suwon-si (KR); Yoon Jong Ju, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 33 days.

(21) Appl. No.: 16/502,272

(22) Filed: Jul. 3, 2019

(65) Prior Publication Data

US 2020/0009621 A1    Jan. 9, 2020

(30) Foreign Application Priority Data

Jul. 5, 2018    (KR) .................. 10-2018-0078333
Sep. 27, 2018    (KR) .................. 10-2018-0115179

(51) Int. Cl.
*H01L 21/67*    (2006.01)
*B08B 7/00*    (2006.01)

(52) U.S. Cl.
CPC ...... *B08B 7/0057* (2013.01); *H01L 21/67051* (2013.01)

(58) Field of Classification Search
CPC ......... H01L 21/02052; H01L 21/02348; H01L 21/67017; H01L 21/67023; H01L 21/67028; H01L 21/6704; H01L 21/67051; H01L 21/6715; H01L 21/67115; B08B 3/02; B08B 7/0035; B08B 7/0057; B08B 7/04
See application file for complete search history.

(56) References Cited

U.S. PATENT DOCUMENTS 6,135,838 A * 10/2000 Wang .................. A61L 9/205
                                                       445/22
8,877,076 B2 * 11/2014 Negoro ............ H01L 21/02282
                                                       216/40

FOREIGN PATENT DOCUMENTS

| JP | 2000-012500 A | 1/2000 |
| JP | 2004-241726 A | 8/2004 |
| JP | 2007-273598 A | 10/2007 |
| JP | 2011-104527 A | 6/2011 |
| KR | 10-2017-0134089 A | 12/2017 |
| KR | 10-2017-0137244 A | 12/2017 |

OTHER PUBLICATIONS

Machine Translation of Niihara, JP 2007-273598 A, Oct. 2007. (Year: 2007).*

* cited by examiner

*Primary Examiner* — David G Cormier
(74) *Attorney, Agent, or Firm* — Harness, Dickey & Pierce, P.L.C.

(57) ABSTRACT

An apparatus for processing a substrate comprises a processing vessel having a processing space inside, a substrate support unit that supports and rotates the substrate in the processing vessel, and a nozzle unit that dispenses a processing liquid onto the substrate. The nozzle unit comprises a nozzle that dispenses the processing liquid and an ultraviolet (UV) light supply unit that emits UV light to activate radicals of the processing liquid dispensed onto the substrate.

10 Claims, 15 Drawing Sheets

SUBSTRATE PROCESSING APPARATUS AND NOZZLE UNIT

CROSS-REFERENCE TO RELATED APPLICATIONS

A claim for priority under 35 U.S.C. § 119 is made to Korean Patent Application No. 10-2018-0078333 filed on Jul. 5, 2018, and Korean Patent Application No. 10-2018-0115179 filed on Sep. 27, 2018, in the Korean Intellectual Property Office, the entire contents of which are hereby incorporated by reference.

BACKGROUND

Embodiments of the inventive concept described herein relate to an apparatus for performing liquid processing on a substrate.

Various processes such as photolithography, deposition, ashing, etching, ion implantation, cleaning, and the like are performed to manufacture semiconductor devices. Among these processes, photolithography, ashing, etching, and cleaning processes are processes that perform liquid processing on a substrate, and various types of liquids are dispensed onto the substrate.

In general, liquid processing is performed on a substrate by dispensing a processing liquid onto the substrate. In an ashing process of removing a photoresist film on a substrate, the photoresist film is removed by activating radicals of a processing liquid. Methods of activating the radicals of the processing liquid include a method of processing a photoresist film by using a strong acidic chemical or a strong basic chemical.

However, in the case of processing the photoresist film with the strong acidic chemical or the strong basic chemical, it is difficult to clean impurities in the air and carbon contamination, and process errors such as a change in the critical dimension (CD) of patterns are caused.

To solve this problem, a method of processing a photoresist film using ozone water has been proposed. Radicals of the ozone water are activated by ultraviolet (UV) light. The ozone water having the activated radicals is dispensed from a nozzle to process a substrate.

However, the radicals are decreased with an increase in dispensing distance and dispensing time in the process in which the ozone water is dispensed onto the substrate from the nozzle. To solve this problem, a method of processing a substrate by raising the concentration of ozone water has been proposed. However, this method causes environmental pollution.

The UV light is emitted by a light emitting member 4, and the light emitting member 4 is installed in a nozzle 2 or on a liquid supply line 6 as illustrated in FIG. 1. The light emitting member 4 comprises a lamp. The lifetime of the lamp may come to an end, or the lamp may be damaged. Due to this, ozone water having deactivated radicals is dispensed onto a substrate W to cause a defect in liquid processing.

SUMMARY

Embodiments of the inventive concept provide an apparatus and a nozzle unit that minimize contamination and damage to a light emitting member by a processing liquid scattered over, or brought into contact with, the light emitting member.

Furthermore, embodiments of the inventive concept provide an apparatus and a nozzle unit that dispense a liquid having a large amount of activated radicals onto a substrate.

In addition, embodiments of the inventive concept provide an apparatus and a nozzle unit that dispense a large amount of radicals onto a substrate without raising the concentration of ozone water.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for processing a substrate comprises a processing vessel having a processing space inside, a substrate support unit that supports and rotates the substrate in the processing vessel, and a nozzle unit that dispenses a processing liquid onto the substrate. The nozzle unit comprises a nozzle that dispenses the processing liquid and an ultraviolet (UV) light supply unit that emits UV light to activate radicals of the processing liquid dispensed on the substrate.

The nozzle unit may further include an arm on which the nozzle and the UV light supply unit are installed and an arm actuator that moves the arm.

The UV light supply unit may include a lamp tube hermetically sealed at opposite ends thereof to form a discharge space inside and a pair of connectors installed on the opposite ends of the lamp tube and including a filament. The lamp tube may have a U-shape that comprises a horizontal portion parallel to the substrate and vertical portions vertically extending upward from opposite ends of the horizontal portion, the connectors being installed on the vertical portions.

The arm may include a lamp mounting part having a receiving space in which the UV light supply unit is received. The receiving space may be open at the bottom that faces the substrate, and the horizontal portion of the lamp tube may be located at the open bottom.

The lamp tube may be formed of a material transmitting the UV light emitted from the lamp tube.

The lamp tube may be formed of a material including quartz glass.

The UV light supply unit may further include a reflector that directs the UV light emitted from the lamp tube toward the substrate.

The reflector may include a reflective surface formed of a flat surface or a curved surface.

The UV light supply unit may further include a lamp protection tube mounted on the lamp tube to surround and protect the lamp tube.

The processing liquid may include ozone water or deionized water.

According to an exemplary embodiment, a nozzle unit comprises an arm, a nozzle that is combined with the arm and that dispenses a processing liquid onto a substrate, and a UV lamp that is combined with the arm and that emits UV light to activate radicals of the processing liquid dispensed on the substrate. The UV lamp comprises a lamp tube exposed toward the substrate and connectors installed on opposite ends of the lamp tube, and the connectors are located in a space sealed from the outside.

The lamp tube may have a U-shape that comprise vertical portions connected with the connectors and a horizontal portion extending from the vertical portions in parallel to a surface of the substrate.

The connectors may be received in a receiving space of a lamp mounting part formed on the arm, so as to be protected from the processing liquid dispensed on the substrate.

The receiving space may include a first space in which the lamp tube is located and a second space in which the connectors are located. The first space and the second space may be partitioned from each other by a partition wall. The first space may be open at one side that faces the substrate.

The horizontal portion may be exposed through the one side of the first space that is open.

The nozzle may be located adjacent to the center of the horizontal portion.

The processing liquid may include ozone water or deionized water.

The UV lamp may further include a reflector that has a reflective surface formed of a flat surface or a curved surface and directs the UV light emitted from the lamp tube toward the substrate.

The UV lamp may further include a lamp protection tube mounted on the lamp tube to surround and protect the lamp tube.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
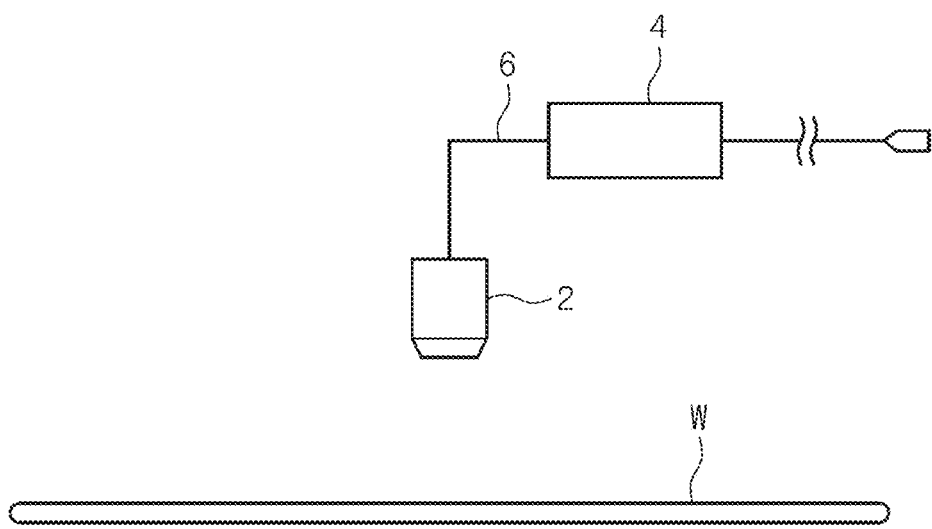
FIG. 1 is a sectional view illustrating a liquid dispensing unit in the related art.

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

Figure 2:
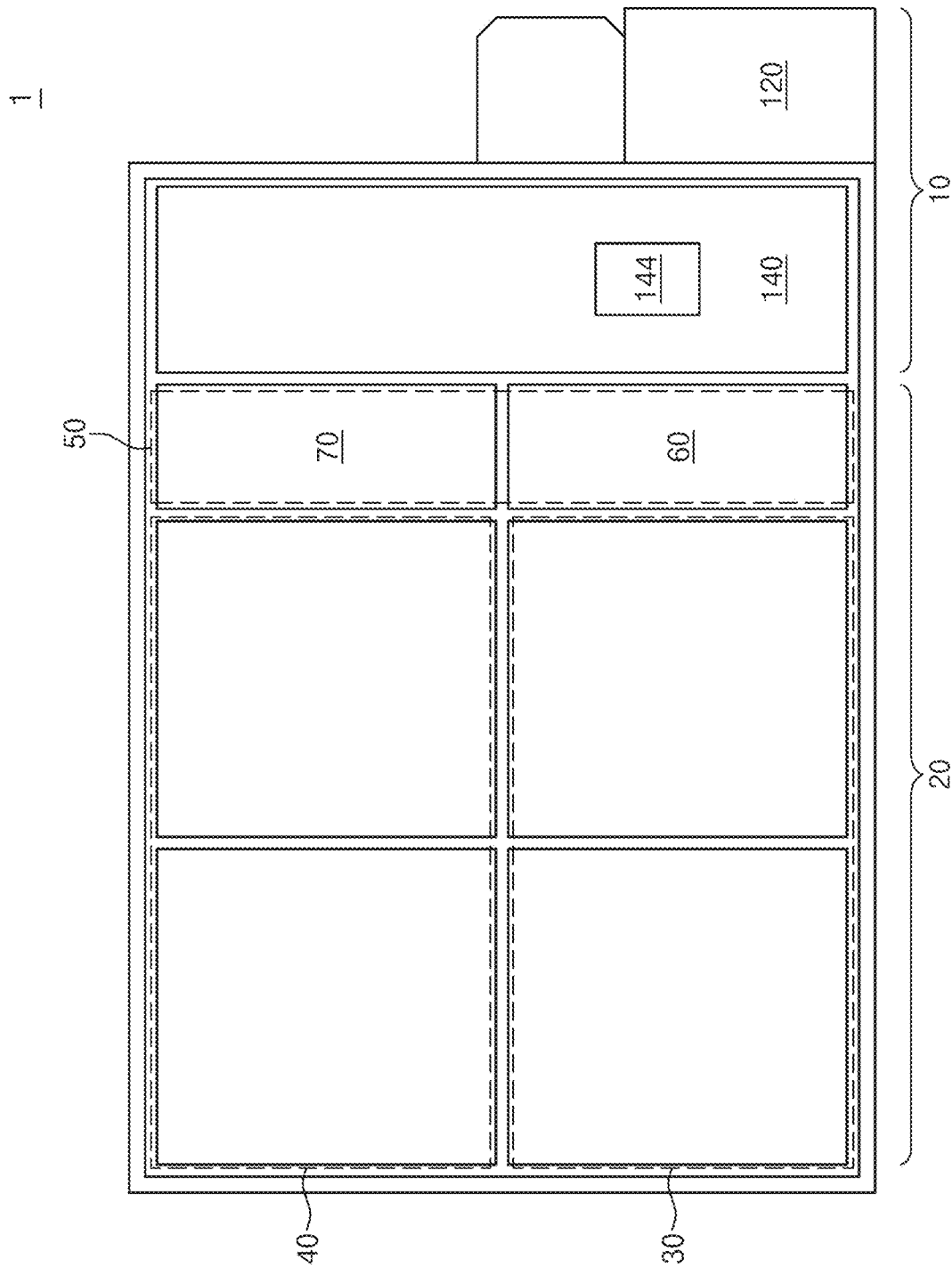
FIG. 2 is a schematic front view illustrating mask cleaning equipment according to an embodiment of the inventive concept.
Figure 3:
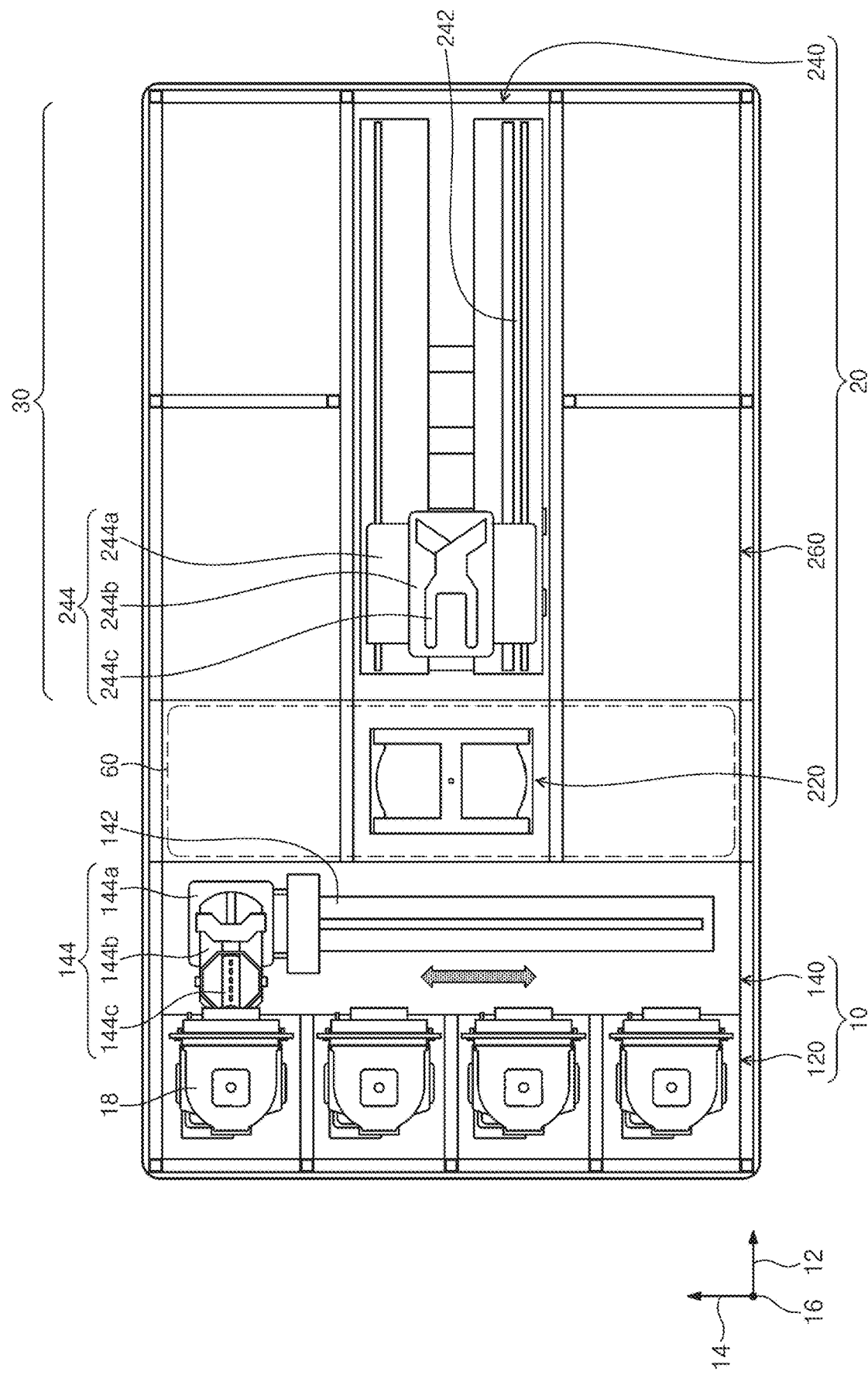
FIG. 3 is a plan view illustrating an index module, a lower buffer, and a lower processing module.
Figure 4:
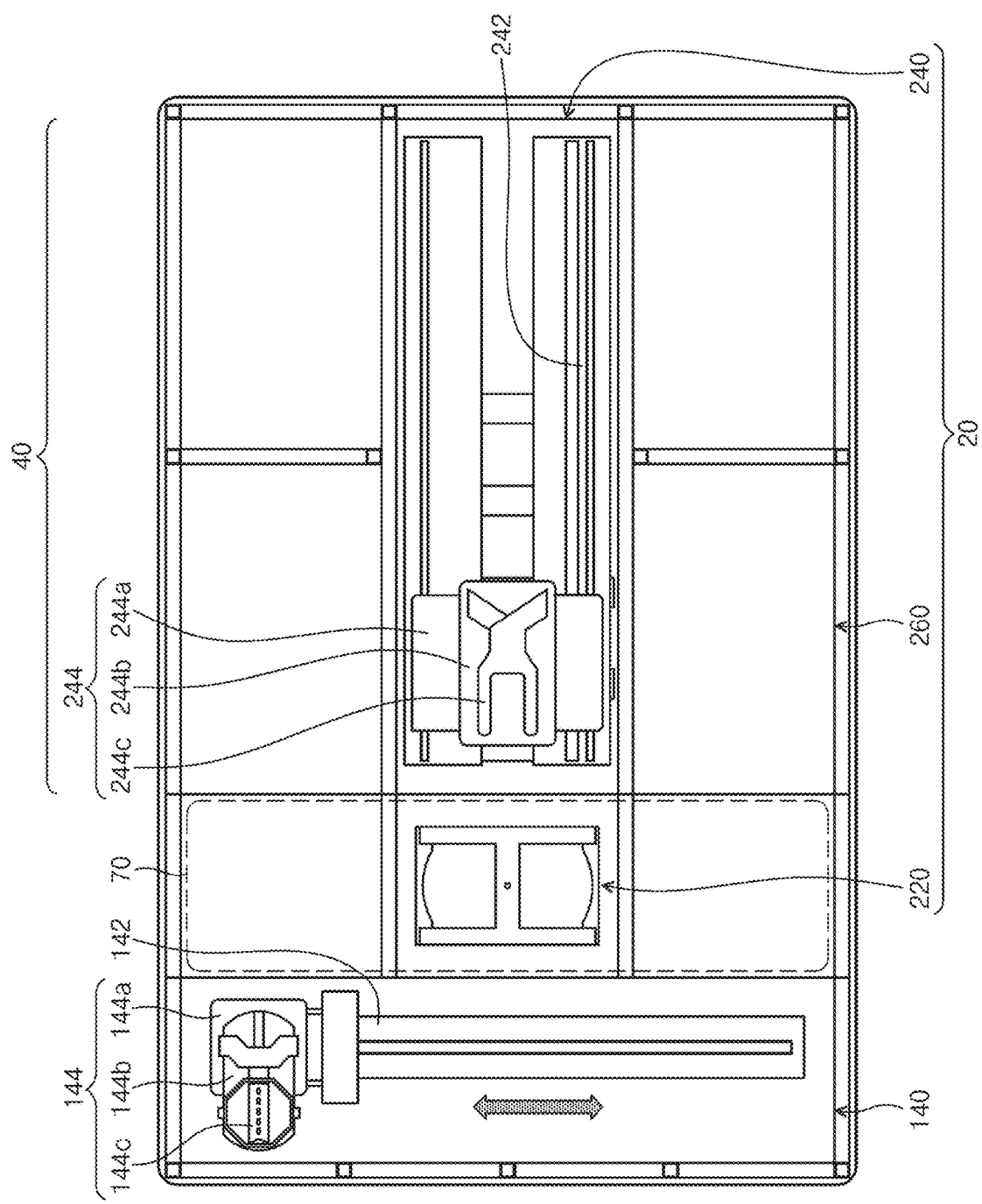
FIG. 4 is a plan view illustrating a transfer frame, an upper buffer, and an upper processing module.

FIG. 2 is a schematic front view illustrating mask cleaning equipment 1 according to an embodiment. FIG. 3 is a plan view illustrating an index module 10, a lower buffer 60, and a lower processing module 30. FIG. 4 is a plan view illustrating a transfer frame 140, an upper buffer 70, and an upper processing module 40.

Referring to FIGS. 2 to 4, the mask cleaning equipment 1 has the index module 10 and a processing module 20. The index module 10 has load ports 120 and the transfer frame 140. The load ports 120, the transfer frame 140, and the processing module 20 are sequentially arranged in a row. Hereinafter, the direction in which the load ports 120, the transfer frame 140, and the processing module 20 are arranged is referred to as an X-direction 12. A direction perpendicular to the X-direction 12 when viewed from above is referred to as a Y-direction 14, and a direction perpendicular to the plane including the X-direction 12 and the Y-direction 14 is referred to as a Z-direction 16.

Carriers 18 in each of which masks are received are placed on the load ports 120. The plurality of load ports 120 are arranged in a row along the Y-direction 14. The number of load ports 120 may be increased or decreased depending on the process efficiency and footprint condition of the processing module 20. Each of the carriers 18 has slots (not illustrated) that are formed therein to support the edges of the masks. The plurality of slots are arranged in the Z-direction 16, and the masks are stacked one above another with a spacing gap therebetween in the carrier 18 along the Z-direction 16.

The processing module 20 has the upper processing module 40 and the lower processing module 30. The upper processing module 40 and the lower processing module 30 each have a transfer housing 240, a buffer unit 220, and process housings 260.

The transfer housing 240 is arranged such that the lengthwise direction thereof is parallel to the X-direction 12. The process housings 260 are disposed on opposite sides of the transfer housing 240 along the Y-direction 14. The process housings 260 on the opposite sides of the transfer housing 240 are symmetric with respect to the transfer housing 240. The transfer housing 240 has a plurality of process housings 260 on the one side thereof. Some of the process housings 260 are arranged along the lengthwise direction of the transfer housing 240. Furthermore, other process housings 260 are stacked one above another. That is, the process housings 260 may be arranged in an A×B array on the one side of the transfer housing 240.

Here, A denotes the number of process housings 260 arranged in a row along the X-direction 12, and B denotes the number of process housings 260 arranged in a column along the Z-direction 16. In the case where four or six process housings 260 are disposed on the one side of the transfer housing 240, the process housings 260 may be arranged in a 2×2 or 3×2 array. The number of process housings 260 may be increased or decreased. Alternatively, the process housings 260 may be provided on only the one side of the transfer housing 240. In another case, the process housings 260 may be provided in a single layer on the opposite sides of the transfer housing 240.

The buffer unit 220 is disposed between the transfer frame 140 and the transfer housing 240. The buffer unit 220 provides a space in which the masks stay before transferred between the process housings 260 and the carriers 18. The buffer unit 220 has the upper buffer 70 and the lower buffer 60. The upper buffer 70 is located over the lower buffer 60. The upper buffer 70 is disposed at the height corresponding to the upper processing module 40. The lower buffer 60 is disposed at the height corresponding to the lower processing module 30. The upper buffer 70 and the lower buffer 60 each include a plurality of slots on which the masks are placed, and the plurality of slots are spaced apart from each other along the Z-direction 16. The buffer unit 220 is open at one side facing the transfer frame 140 and at an opposite side facing the transfer housing 240.

The transfer frame 140 transfers the masks between the carriers 18 placed on the load ports 120 and the buffer unit 220. An index rail 142 and an index robot 144 are provided in the transfer frame 140. The index rail 142 is arranged such that the lengthwise direction thereof is parallel to the Y-direction 14. The index robot 144 is mounted on the index rail 142 and linearly moves along the index rail 142 in the Y-direction 14.

The index robot 144 has a base 144a, a body 144b, and a plurality of index arms 144c. The base 144a is installed so as to be movable along the index rail 142. The body 144b is combined with the base 144a. The body 144b is movable on the base 144a along the Z-direction 16. Furthermore, the body 144b is rotatable on the base 144a. The index arms 144c are combined with the body 144b and are movable forward and backward relative to the body 144b. The plurality of index arms 144c may operate individually. The index arms 144c are stacked one above another with a spacing gap therebetween along the Z-direction 16. Some of the index arms 144c may be used to transfer the masks from the processing module 20 to the carriers 18, and the other index arms 144c may be used to transfer the masks from the carriers 18 to the processing module 20. Accordingly, particles generated from masks to be processed may be prevented from adhering to processed masks in the process in which the index robot 144 transfers the masks between the carriers 18 and the processing module 20.

The transfer housing 240 transfers the masks between the buffer unit 220 and the process housings 260 and between the process housings 260. A guide rail 242 and a main robot 244 are provided in the transfer housing 240. The guide rail 242 is arranged such that the lengthwise direction thereof is parallel to the X-direction 12. The main robot 244 is mounted on the guide rail 242 and linearly moves on the guide rail 242 along the X-direction 12. The main robot 244 has a base 244a, a body 244b, and a plurality of main arms 244c. The base 244a is installed so as to be movable along the guide rail 242. The body 244b is combined with the base 244a. The body 244b is movable on the base 244a along the Z-direction 16. Furthermore, the body 244b is rotatable on the base 244a. The main arms 244c are combined with the body 244b and are movable forward and backward relative to the body 244b. The plurality of main arms 244c may operate individually. The main arms 244c are stacked one above another with a spacing gap therebetween along the Z-direction 16.

Mask cleaning apparatuses for performing cleaning processes on the masks are provided in the process housings 260. The mask cleaning apparatuses may have different structures depending on the types of cleaning processes. Alternatively, the mask cleaning apparatuses in the respective process housings 260 may have the same structure. According to an embodiment, the lower processing module 30 may include a chamber for performing a wet cleaning process and a chamber for performing a cooling process. The upper processing module 40 may include a chamber for performing a dry and functional water cleaning process and a chamber for performing a heating process.

Hereinafter, a mask cleaning apparatus may be a chamber for performing the aforementioned wet cleaning process. An example of a mask cleaning apparatus that performs mask cleaning and removal of organic matter using ultraviolet (UV) light and a chemical will be described below. The inventive concept can be applied to clean various substrates such as a semiconductor wafer, a substrate for liquid crystal, and the like, in addition to a mask.

Figure 5:
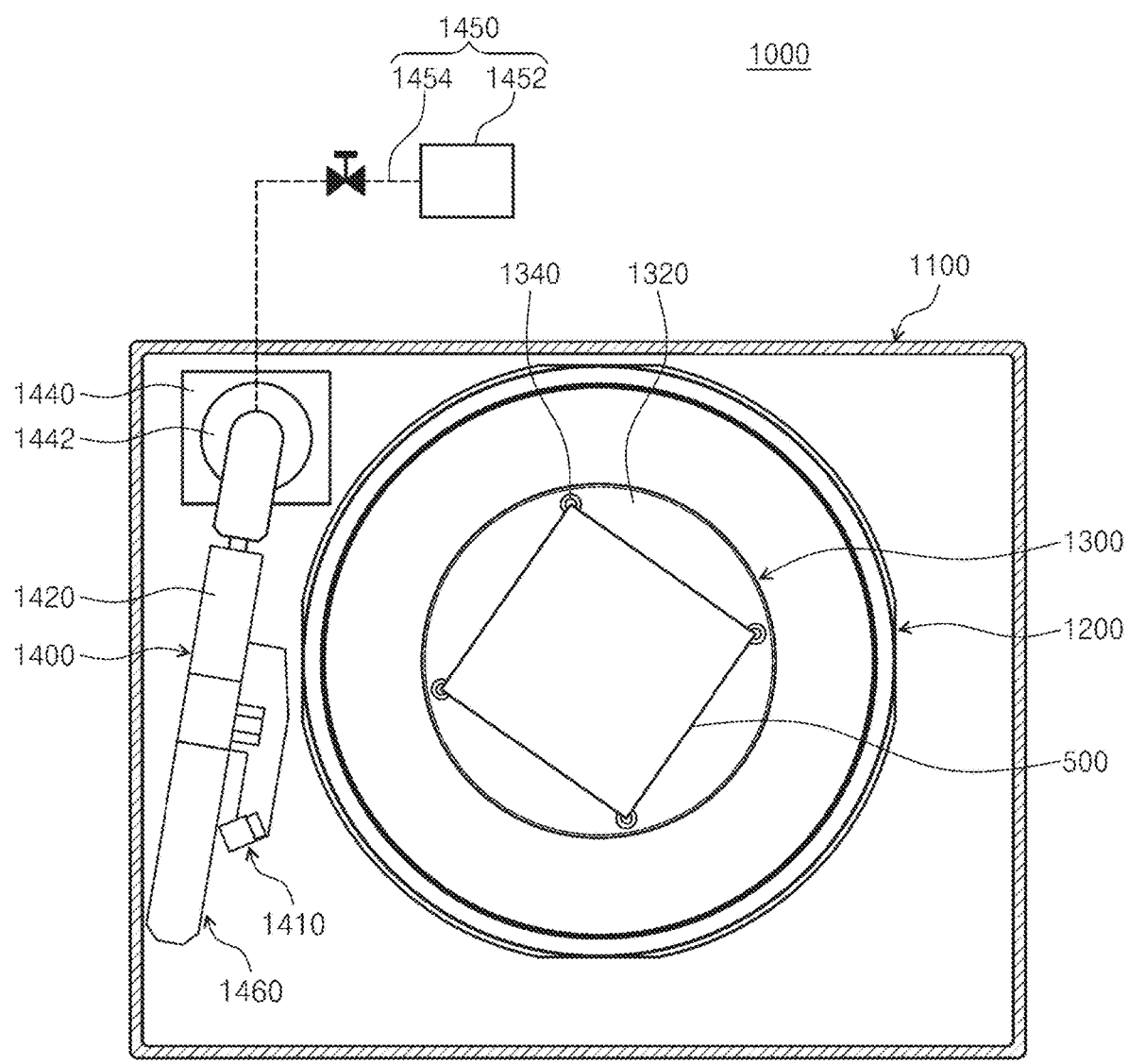
FIG. 5 is a plan view illustrating a mask cleaning apparatus of FIG. 3.
Figure 6:
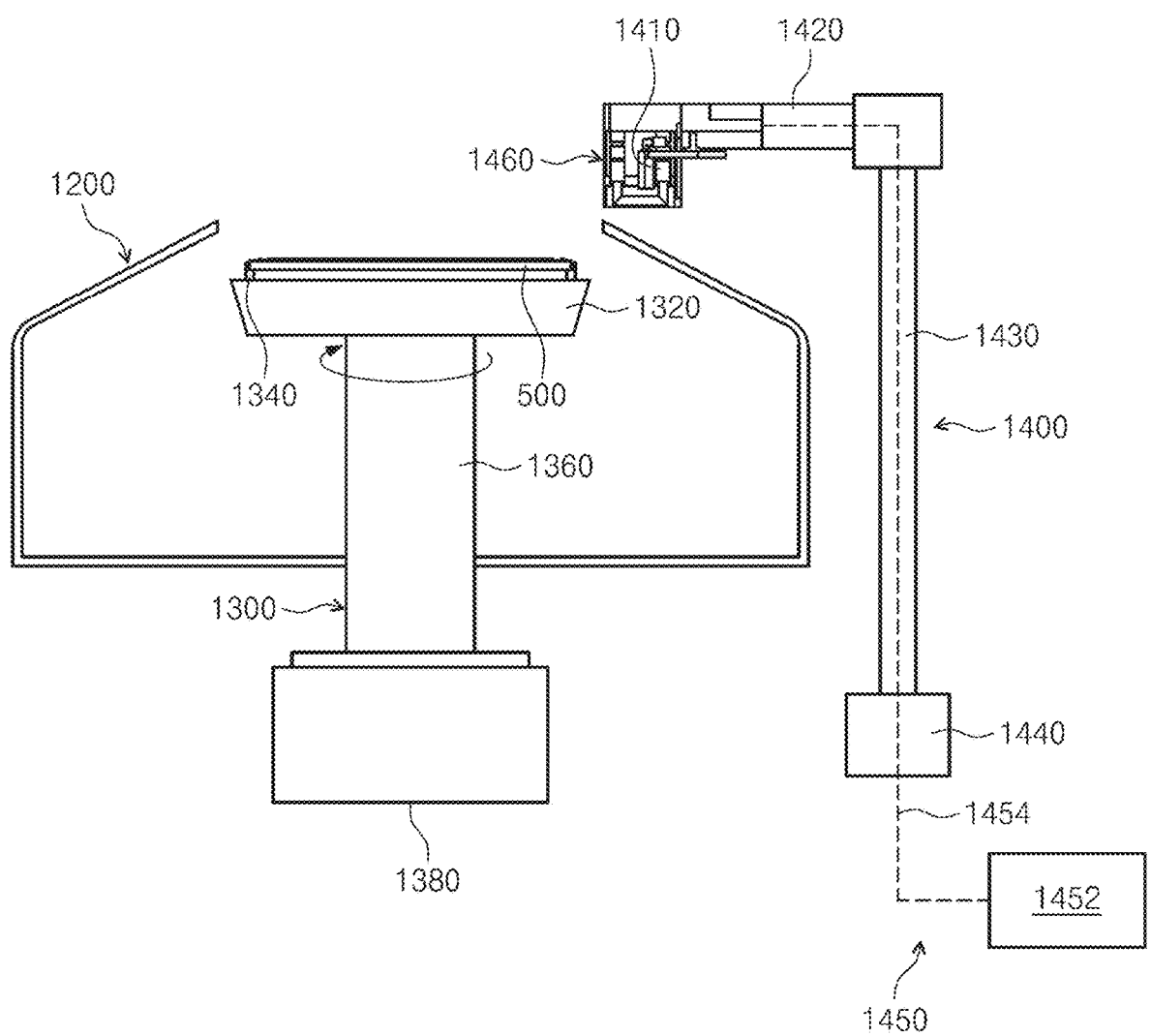
FIG. 6 is a side view illustrating the mask cleaning apparatus of FIG. 5.

FIG. 5 is a plan view illustrating a mask cleaning apparatus 1000 of FIG. 3. FIG. 6 is a side view illustrating the mask cleaning apparatus 1000 of FIG. 5.

The mask cleaning apparatus 1000 removes organic matter on the surface of a mask 500.

Referring to FIGS. 5 and 6, the mask cleaning apparatus 1000 comprises a housing 1100, a bowl 1200, a support member 1300, and a nozzle unit 1400.

The housing 1100 provides a sealed inner space. A fan filter unit (not illustrated) may be installed on an upper wall of the housing 1100. The fan filter unit generates a downward vertical air flow in the inner space of the housing 1100.

The bowl 1200 is disposed in the housing 1100. The bowl 1200 prevents a chemical (a processing liquid) used in a process and fumes generated in the process from being scattered or released to the outside. The bowl 1200 has an inner space that is open at the top, and the mask 500 is processed in the inner space of the bowl 1200.

The support member 1300 is located in the bowl 1200. The support member 1300 supports the mask 500 during processing. The support member 1300 comprises a support plate 1320, chucking pins 1340, a support shaft 1360, and a support plate actuator 1380.

The support plate 1320 has a substantially circular shape. The support plate 1320 has a larger diameter than the mask 500. The support plate 1320 supports the mask 500. The mask 500 is supported on the support plate 1320 to face upward while the chemical is dispensed. The chucking pins 1340 are provided on an upper surface of the support plate 1320. The chucking pins 1340 protrude upward from the upper surface of the support plate 1320. The chucking pins 1340 prevent the mask 500 from escaping from the support plate 1320 to a side by a centrifugal force when the support plate 1320 is rotated. When the mask 500 is placed in a correct position on the support plate 1320, two chucking pins 1340 support each corner of the mask 500. Accordingly, a total of eight chucking pins 1340 are provided. During processing, the chucking pins 1340 support the four corners of the mask 500 to prevent the mask 500 from escaping from the correct position. The support shaft 1360 is connected to the center of the bottom of the support plate 1320. The support shaft 1360 supports the support plate 1320. The support shaft 1360 is provided to correspond to the central axis of the support plate 1320. The support plate actuator 1380 is connected to a lower end of the support shaft 1360. The support plate actuator 1380 rotates the support plate 1320. The support shaft 1360 transmits the torque of the support plate actuator 1380 to the support plate 1320. The support plate actuator 1380 is controlled by a controller. The support plate actuator 1380 may include a motor.

A lifting unit (not illustrated) vertically moves the bowl 1200 to adjust the height of the support plate 1320 relative to the bowl 1200. The lifting unit moves the bowl 1200 downward to allow the support plate 1320 to protrude upward beyond the bowl 1200 when the mask 500 is loaded onto, or unloaded from, the support plate 1320.

The nozzle unit 1400 is disposed on one side of the bowl 1200. The nozzle unit 1400 supplies the processing liquid and UV light to an upper surface of the mask 500 to remove the organic matter from the mask 500. The nozzle unit 1400 comprises a nozzle 1410, an arm 1420, an arm support shaft 1430, an arm actuator 1440, and a UV light supply unit 1460.

The arm 1420 has a rod shape and supports the nozzle 1410 and the UV light supply unit 1460. The arm 1420 may be arranged such that the lengthwise direction thereof is parallel to the support plate 1320. The nozzle 1410 is combined with the arm 1420 at one end of the arm 1420, and the arm 1420 is combined with the arm support shaft 1430 at an opposite end of the arm 1420. The arm support shaft 1430 supports the arm 1420. The arm support shaft 1430 is arranged such that the lengthwise direction thereof is parallel to the vertical direction. The arm 1420 may be swung about the arm support shaft 1430, or may be raised or lowered, by the arm actuator 1440. The arm actuator 1440 is connected to a lower end of the arm support shaft 1430.

The arm actuator 1440 moves the nozzle 1410 between a standby position and a process position. The standby position is a position on one side of the housing 1100. The process position is a position directly above the support plate 1320. The process position may include a first process position and a second process position.

A processing liquid supply unit 1450 comprises a processing liquid supply source 1452 and a processing liquid supply line 1454. The processing liquid supply line 1454 connects the processing liquid supply source 1452 and the nozzle 1410. The processing liquid stored in the processing liquid supply source 1452 is supplied into the nozzle 1410 through the processing liquid supply line 1454. A valve for opening or closing the processing liquid supply line 1454 may be installed on the processing liquid supply line 1454. For reference, the processing liquid may include O3DIW or DIW.

Figure 7:
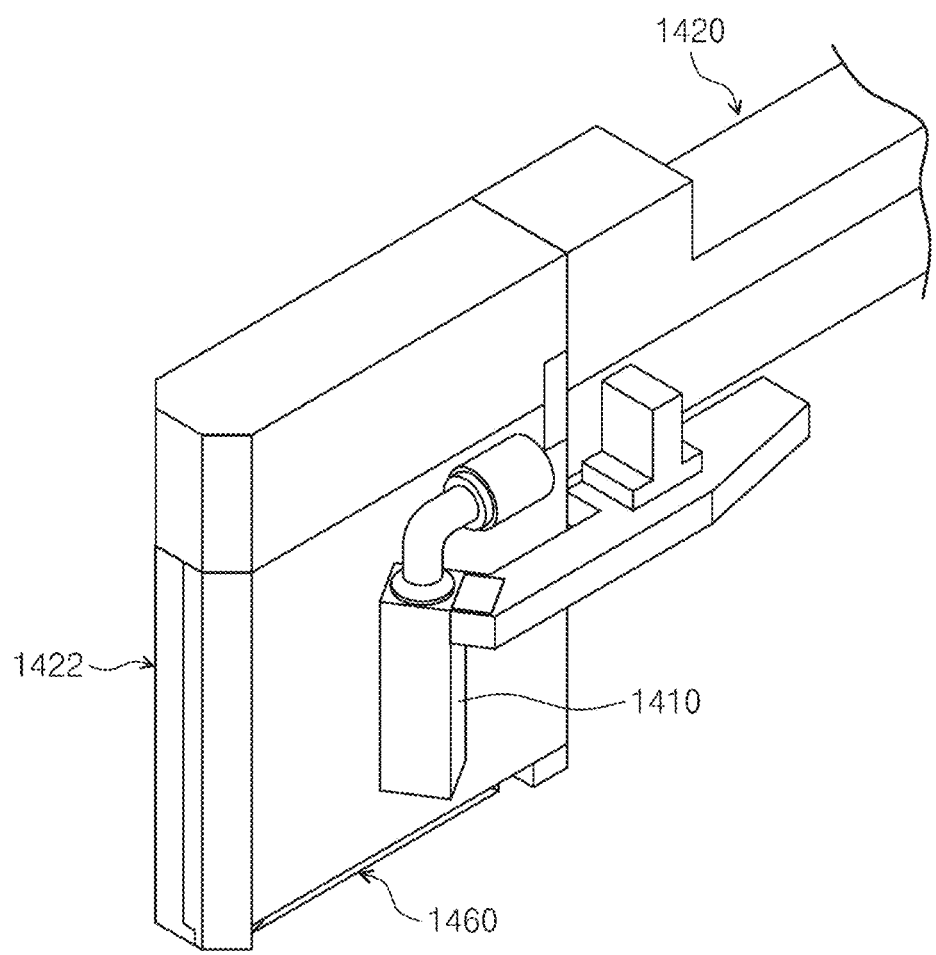
FIG. 7 is a perspective view illustrating an arm.
Figure 8:
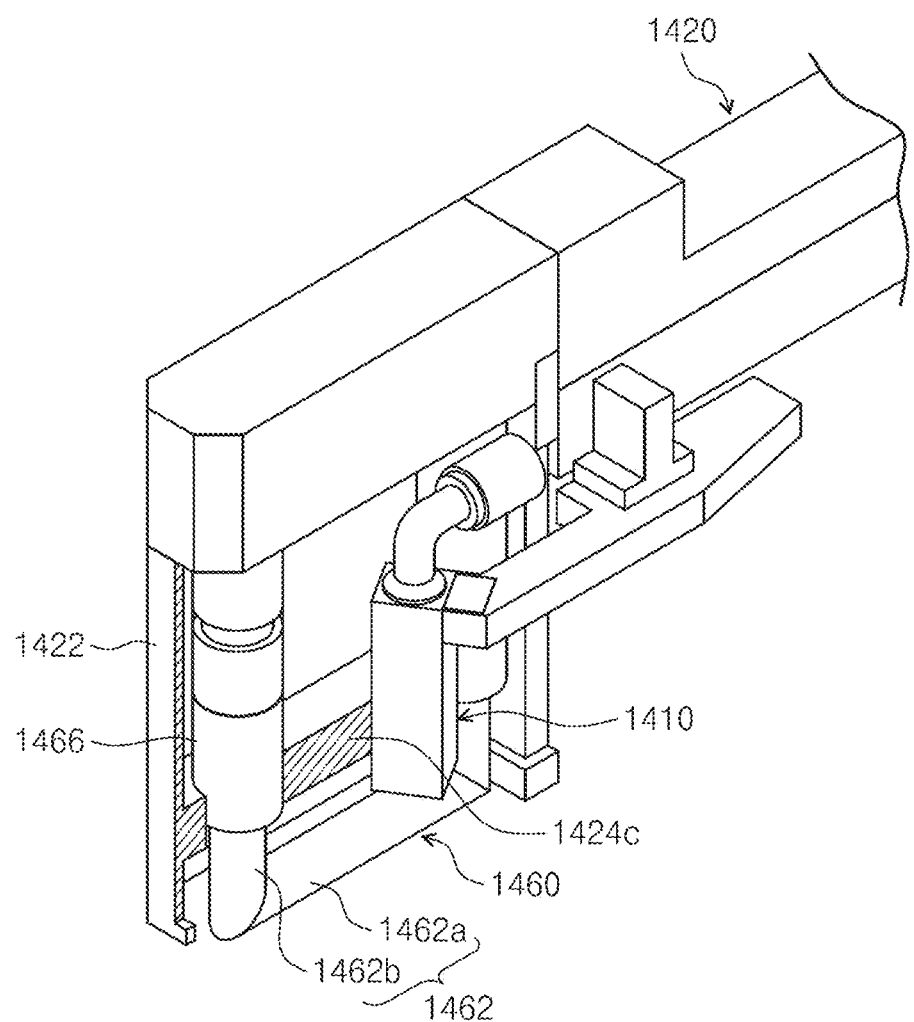
FIGS. 8 and 9 are views illustrating a UV light supply unit installed on the arm in FIG. 7.
Figure 9:
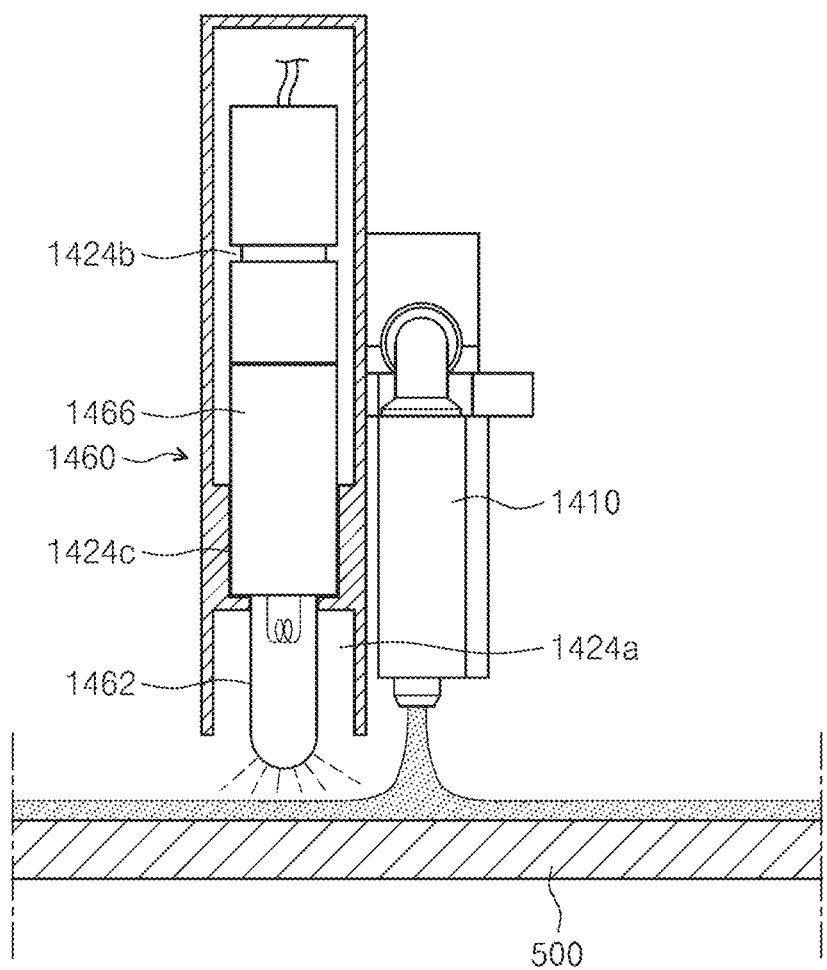
Figure 10:
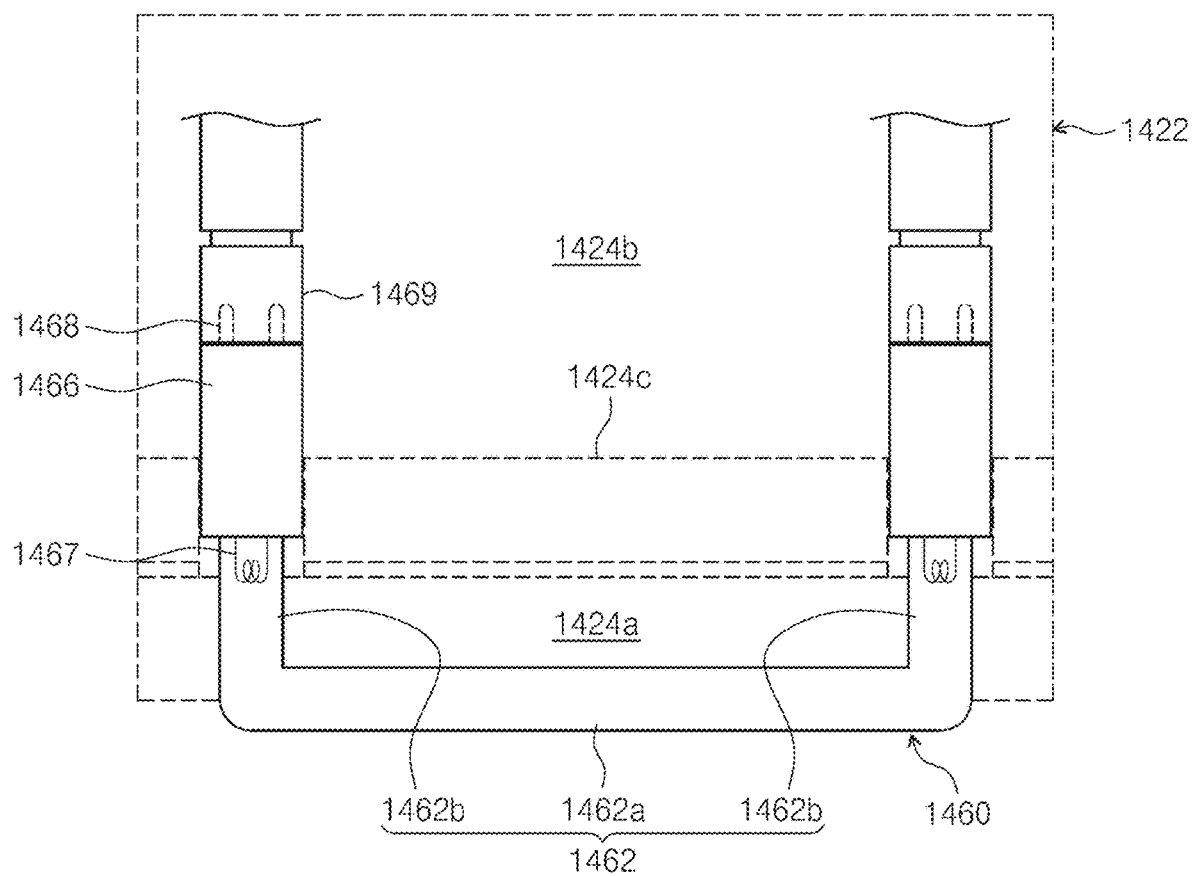
FIGS. 10 and 11 are views illustrating a lamp mounting part of the arm.
Figure 11:
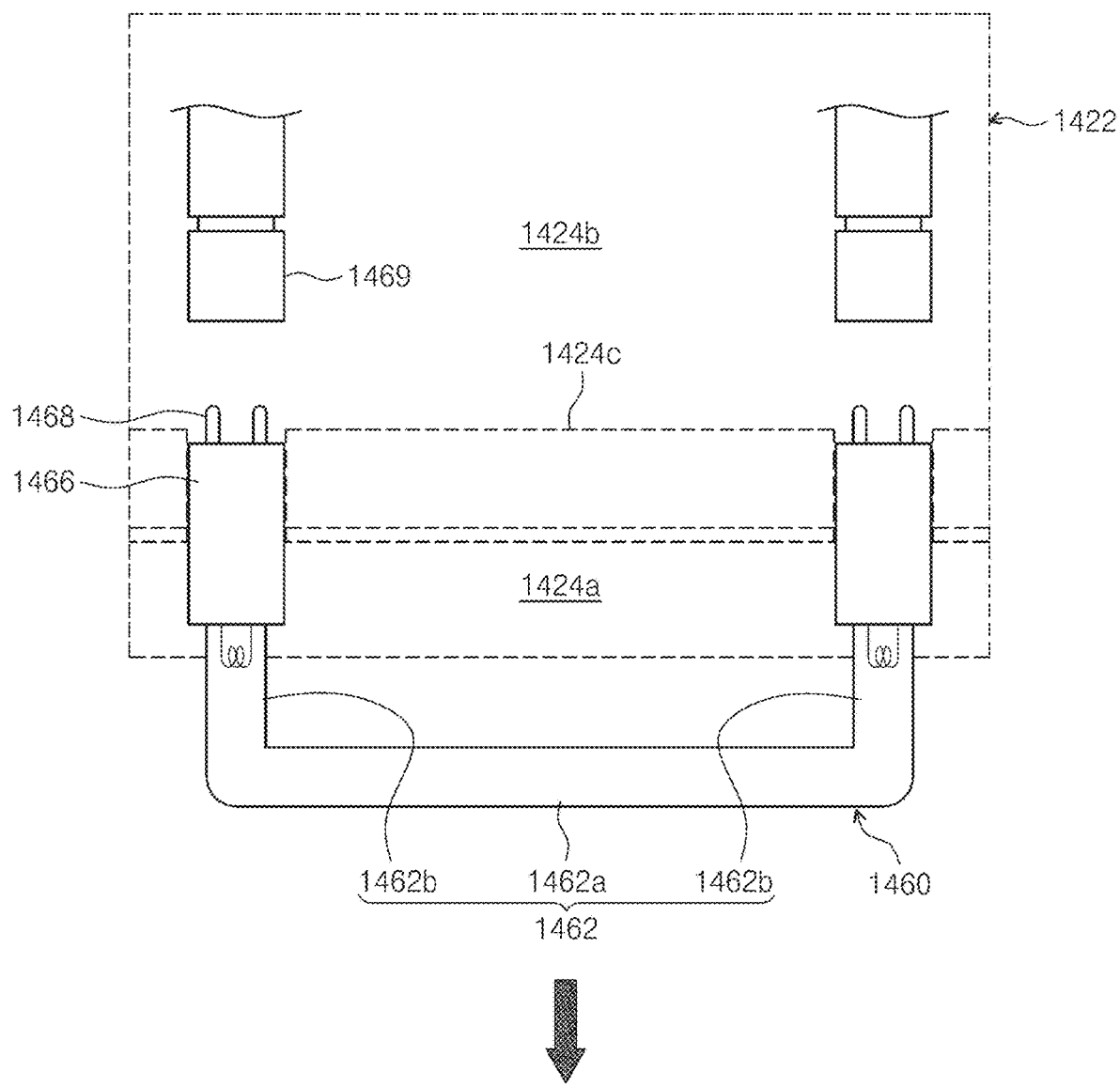

FIG. 7 is a perspective view illustrating the arm 1420. FIGS. 8 and 9 are views illustrating the UV light supply unit 1460 installed on the arm 1420 in FIG. 7. FIGS. 10 and 11 are views illustrating a lamp mounting part 1422 of the arm 1420.

Referring to FIGS. 7 to 11, the UV light supply unit 1460 (hereinafter, referred to as the UV lamp) supplies UV light for activating radicals of the processing liquid dispensed on the mask 500.

The UV lamp 1460 may include a lamp tube 1462 and connectors 1466. For example, the UV light of the UV lamp 1460 may have a wavelength range of 185 nm to 254 nm. The lamp tube 1462 may have a UV light transmittance of 90% or more. For example, the lamp tube 1462 may be formed of a material including quartz glass.

The lamp tube 1462 may be hermetically sealed at opposite ends thereof to form a discharge space therein. The lamp tube 1462 may have a U-shape that comprises a horizontal portion 1462*a* parallel to the mask 500 and vertical portions 1462*b* vertically extending upward from opposite ends of the horizontal portion 1462*a*. The lamp tube 1462 having the distinctive shape is advantageous in that the horizontal portion 1462*a* is able to be brought to a very close location to the processing liquid dispensed on the mask 500.

The connectors 1466 may be installed on the opposite ends of the lamp tube 1462, respectively. The connectors 1466 may include filaments 1467 located in the vertical portions 1462*b* of the lamp tube 1460. In general, the filaments 1467 may be implemented with a double coil or a triple coil that is made of a tungsten coil, and the tungsten coil may be coated with barium oxide, strontium oxide, calcium oxide, or the like that easily emits thermal electrons. Each of the connectors 1466 may include terminals 1468 that protrude to receive external power. The connectors 1466 may be connected to connector receptacles 1469 fixedly installed on the arm 1420.

In the inventive concept, the connectors 1466 and the connector receptacles 1469 are located in an enclosed section (corresponding to a second space 1424*b*) in the lamp mounting part 1422 of the arm 1420, and therefore the processing liquid may be prevented in advance from being brought into contact with the connection portions of the connectors 1466 and the connector receptacles 1469.

The arm 1420 may include the lamp mounting part 1422 having a receiving space 1424 in which the UV light supply unit 1460 is received. The receiving space 1424 is open at the bottom thereof that faces the mask 500, and the horizontal portion 1462*a* of the lamp tube 1462 is located at the open bottom side.

More specifically, the receiving space 1424 of the lamp mounting part 1422 may include a first space 1424*a* and the second space 1424*b*, and the first space 1424*a* and the second space 1424*b* may be partitioned from each other by a partition wall 1424*c*.

The first space 1424*a* may be open at one side thereof that faces the mask 500. The lamp tube 1462 may be located in the first space 1424*a*, and the connectors 1466 may be located in the second space 1424*b*. The second space 1424*b* may be isolated from an external environment. The first space 1424*a* may be open at the one side thereof that faces the mask 500.

The nozzle 1410 and the UV light supply unit 1460, which are installed on the arm 1420 as described above, swing together to activate the radicals of the processing liquid dispensed on the mask 500.

Figure 15:
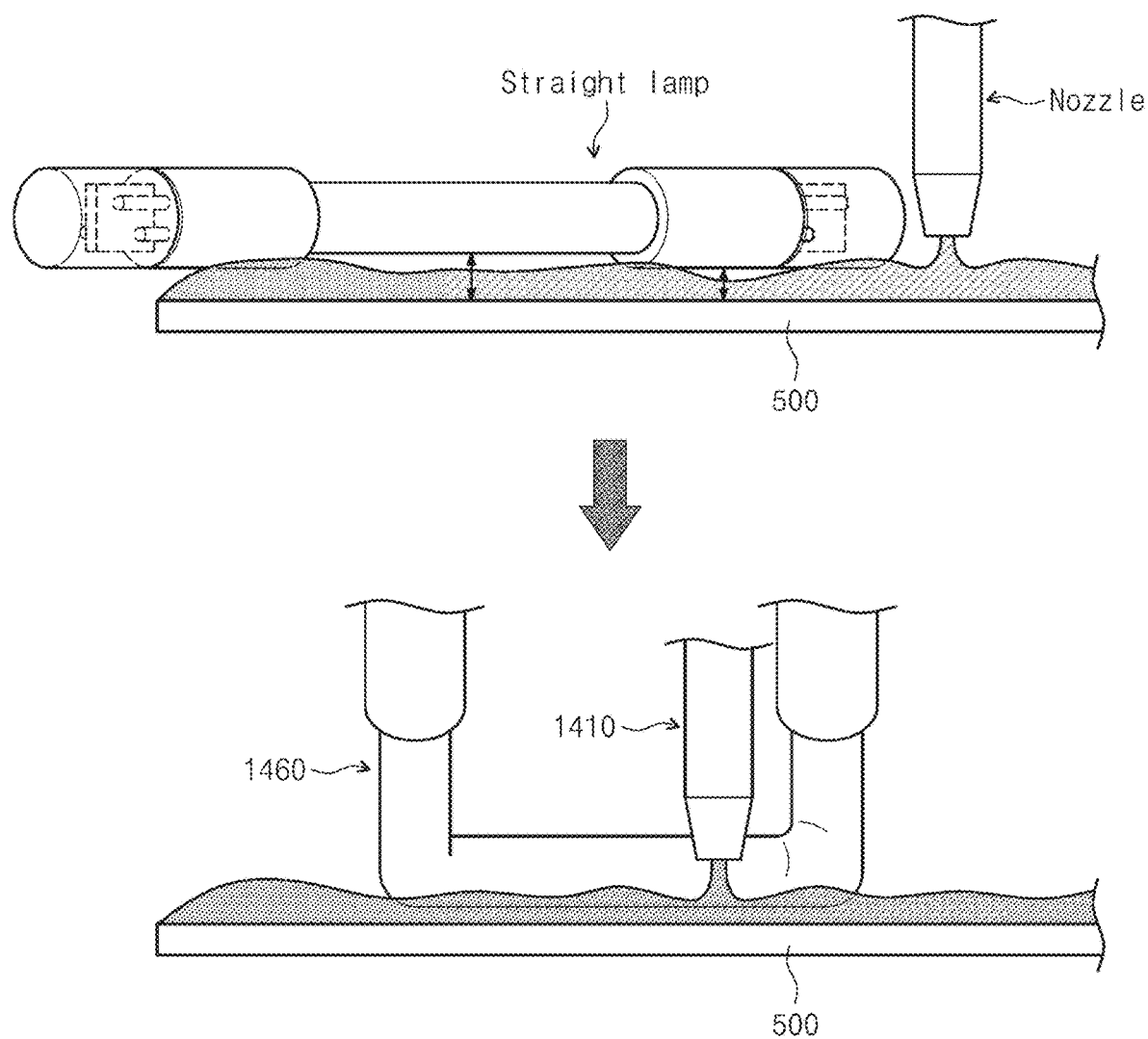
FIG. 15 is a view illustrating a problem that arises when a straight UV lamp is used.

Referring to FIG. 15, the UV lamp 1460 has the U-shaped lamp tube 1462, and thus the horizontal portion of the lamp tube 1462 may be located close to the mask 500. In the case where a UV lamp has a straight lamp tube, there is a limitation in reducing the gap between the mask 500 and the lamp tube due to connectors installed on opposite ends of the lamp tube.

However, the U-shaped lamp tube 1462 has the connectors on the vertical portions thereof, and thus the horizontal portion of the U-shaped lamp tube 1462 may be located closer to the mask 500 than the straight lamp tube, thereby maximizing the intensity of UV light irradiated to the mask 500, which in turn improves the efficiency in activating OH radicals of the processing liquid.

In addition, the connectors 1466 may be prevented from being contaminated by the processing liquid scattered over, or brought into contact with, the connectors 1466. Thus, the durability and stability of cables connected to the connectors 1466 may be improved.

Although it has been exemplified in the inventive concept that the lamp tube emits UV light at a position spaced apart from the processing liquid, the lamp tube may emit UV light in contact with the processing liquid when necessary. The contact of the lamp tube with the processing liquid is possible because the connectors have a structure completely protected from the processing liquid.

Figure 12:
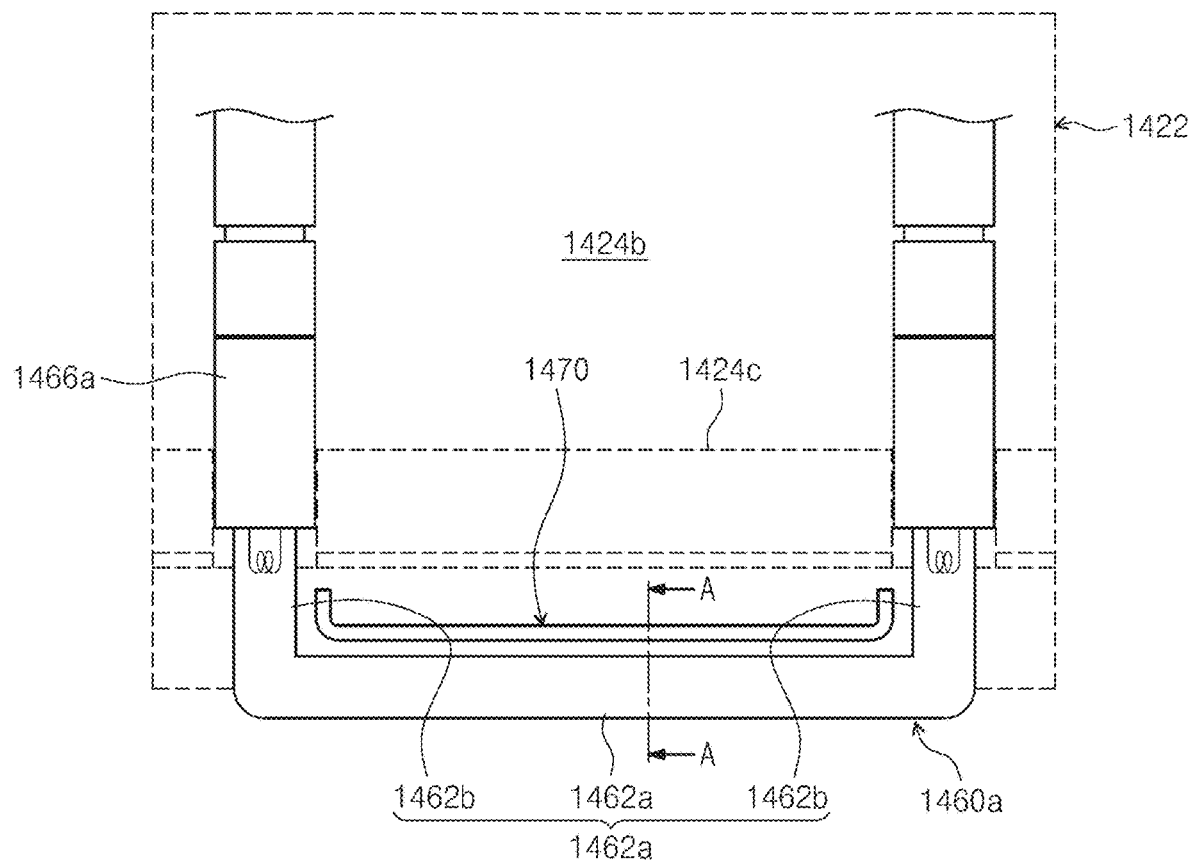
FIG. 12 is a view illustrating a first modified embodiment of the UV light supply unit.
Figure 13:
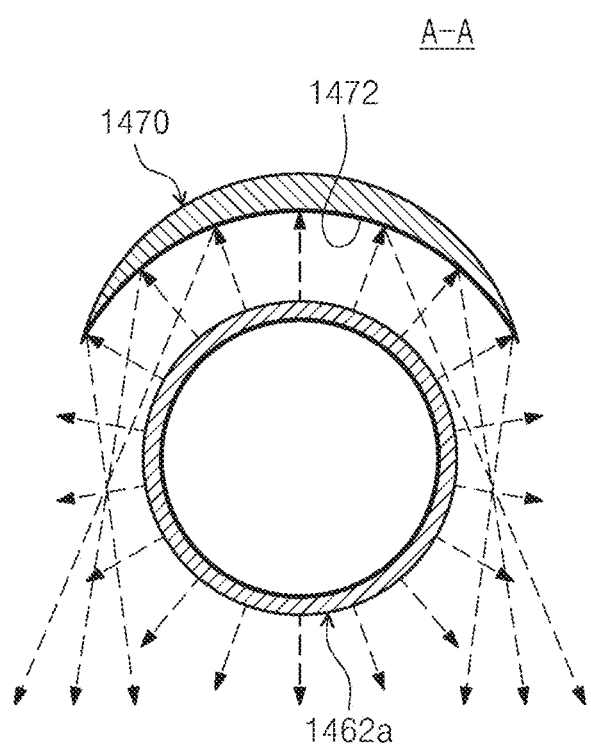
FIG. 13 is a sectional view taken along line A-A of FIG. 12.

FIG. 12 is a view illustrating a first modified embodiment of the UV light supply unit. FIG. 13 is a sectional view taken along line A-A of FIG. 12.

Referring to FIGS. 12 and 13, a UV light supply unit 1460a comprises a lamp tube 1462a and connectors 1466a. The lamp tube 1462a and the connectors 1466a have configurations and functions substantially similar to those of the lamp tube 1462 and the connectors 1466 of the UV light supply unit 1460 illustrated in FIG. 10. Therefore, the following description will be focused on the difference therebetween.

The UV light supply unit 1460a in the first modified embodiment differs from the UV light supply unit 1460 in that the former further comprises a reflector 1470. The reflector 1470 may direct UV light emitted from the lamp tube 1462a toward the mask 500, thereby maximizing the intensity of the UV light irradiated to the mask 500. The reflector 1470 may include a curved reflective surface 1472. Without being limited thereto, however, the reflective surface 1472 may be formed of a flat surface or may be formed in another shape.

Figure 14:
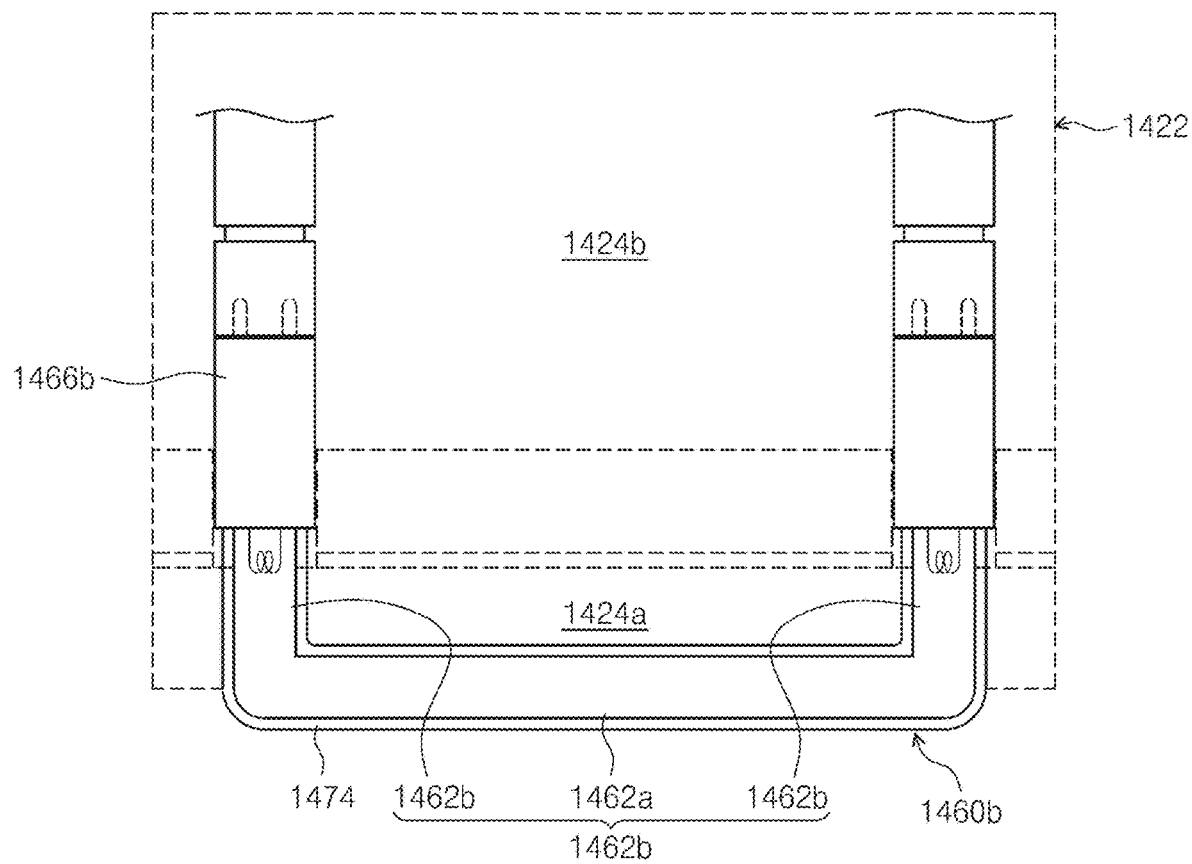
FIG. 14 is a view illustrating a second modified embodiment of the UV light supply unit.

FIG. 14 is a view illustrating a second modified embodiment of the UV light supply unit.

Referring to FIG. 14, a UV light supply unit 1460b comprises a lamp tube 1462b and connectors 1466b. The lamp tube 1462b and the connectors 1466b have configurations and functions substantially similar to those of the lamp tube 1462 and the connectors 1466 of the UV light supply unit 1460 illustrated in FIG. 10. Therefore, the following description will be focused on the difference therebetween.

The UV light supply unit 1460b in the second modified embodiment differs from the UV light supply unit 1460 in that the former further comprises a lamp protection tube 1474. The lamp protection tube 1474 may be mounted on the lamp tube 1462b and may prevent damage to the lamp tube 1462b due to external impacts.

According to the embodiments of the inventive concept, the light emitting member that emits UV light is located close to the processing liquid dispensed on the substrate. Thus, a large amount of activated radicals may be supplied on the substrate from the processing liquid with low concentration.

According to the embodiments of the inventive concept, the connectors of the light emitting member that emits UV light are prevented in advance from being brought into contact with the processing liquid. Thus, the durability and stability of the connectors may be improved.

According to the embodiments of the inventive concept, the lamp having the U-shape is located close to the substrate. Thus, the lamp may efficiently activate the radicals of the processing liquid, thereby improving process performance.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe the exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
 a processing vessel having a processing space inside;
 a substrate support unit configured to support and rotate the substrate in the processing vessel;
 a nozzle unit configured to dispense a processing liquid onto the substrate; and
 an arm on which the nozzle unit is installed,
 wherein the nozzle unit comprises,
 a nozzle configured to dispense the processing liquid, and
 an ultraviolet (UV) lamp configured to emit UV light to activate radicals of the processing liquid dispensed on the substrate, the UV lamp including,
 a lamp tube having a U-shape that comprises a horizontal portion parallel to the substrate and vertical portions vertically extending upward from opposite ends of the horizontal portion, and
 a pair of connectors installed on opposite ends of the lamp tube, and
 wherein the arm includes a lamp mounting part including a receiving space in which the UV lamp is provided, a bottom of the receiving space is open and faces the substrate, the horizontal portion of the lamp tube is at the bottom of the receiving space, the receiving space includes an enclosed space, and the pair of connectors are sealed in the enclosed space.

2. The apparatus of claim 1, wherein the nozzle unit further comprises:
 an arm actuator configured to move the arm.

3. The apparatus of claim 2, wherein
 the lamp tube is hermetically sealed at opposite ends thereof to form a discharge space inside; and
 the pair of connectors includes a filament.

4. The apparatus of claim 1, wherein the lamp tube is formed of a material transmitting the UV light emitted from the lamp tube.

5. The apparatus of claim 1, wherein the lamp tube is formed of a material including quartz glass.

6. The apparatus of claim 1, wherein the UV lamp further comprises:
   a reflector configured to direct the UV light emitted from the lamp tube toward the substrate.

7. The apparatus of claim 6, wherein the reflector comprises a reflective surface formed of a flat surface or a curved surface.

8. The apparatus of claim 1, wherein the UV lamp further comprises:
   a lamp protection tube mounted on the lamp tube to surround and protect the lamp tube.

9. The apparatus of claim 1, wherein the processing liquid comprises ozone water or deionized water.

10. The apparatus of claim 1, wherein the receiving space further includes another space partitioned from the enclosed space by a partition wall, a bottom of the another space is open, and the horizontal portion of the lamp tube is provided at the bottom of the another space.

* * * * *